(12) United States Patent
Kasmer

(10) Patent No.: US 8,289,745 B2
(45) Date of Patent: Oct. 16, 2012

(54) POWER SUPPLY WITH MAGISTOR SWITCHING

(75) Inventor: Thomas E. Kasmer, Johnson City, NY (US)

(73) Assignee: Magistor Technologies, L.L.C., Bloomfield Hills, MI (US)

( * ) Notice: Subject to any disclaimer, the term of this patent is extended or adjusted under 35 U.S.C. 154(b) by 371 days.

(21) Appl. No.: 12/685,078

(22) Filed: Jan. 11, 2010

(65) Prior Publication Data

US 2010/0178550 A1    Jul. 15, 2010

Related U.S. Application Data

(60) Provisional application No. 61/204,962, filed on Jan. 13, 2009.

(51) Int. Cl.
*H02M 7/538* (2007.01)

(52) U.S. Cl. .......................................... 363/134; 363/24

(58) Field of Classification Search .................... 363/24, 363/25, 26, 134
See application file for complete search history.

(56) References Cited

U.S. PATENT DOCUMENTS

| | | | | |
|---|---|---|---|---|
| 3,225,209 A * | 12/1965 | Schuster | ........................ | 307/80 |
| 3,308,397 A * | 3/1967 | Morgan | ..................... | 331/113 A |
| 3,317,856 A * | 5/1967 | Wilkinson | ................ | 331/113 A |
| 3,337,787 A * | 8/1967 | Joseph | ............................ | 363/24 |
| 3,350,620 A * | 10/1967 | Barron | ............................ | 363/24 |
| 3,351,839 A * | 11/1967 | Johnson et al. | ................ | 363/134 |
| 3,361,952 A * | 1/1968 | Bishop | .......................... | 363/134 |
| 3,365,657 A * | 1/1968 | Webb | .......................... | 323/206 |
| 3,467,852 A * | 9/1969 | Klimo et al. | .................. | 363/134 |
| 3,490,027 A * | 1/1970 | Galetto et al. | .................. | 363/24 |
| 3,667,027 A * | 5/1972 | Martin | ...................... | 363/56.06 |
| 3,717,808 A | 2/1973 | Horna | | |
| 3,916,283 A * | 10/1975 | Burrows | ......................... | 363/26 |
| 4,156,173 A | 5/1979 | Taralp | | |
| 4,639,844 A * | 1/1987 | Gallios et al. | .................. | 363/17 |
| 4,747,035 A * | 5/1988 | Bobry | ............................ | 363/24 |
| 4,760,484 A * | 7/1988 | Walker | .......................... | 361/18 |
| 4,777,466 A | 10/1988 | Bordalen | | |
| 5,164,682 A | 11/1992 | Taralp | | |
| 5,473,300 A | 12/1995 | Watson | | |
| 5,684,683 A | 11/1997 | Divan et al. | | |
| 5,705,971 A | 1/1998 | Skibinski | | |
| 6,031,737 A | 2/2000 | Green | | |
| 2005/0088859 A1* | 4/2005 | Scollo et al. | .................... | 363/24 |
| 2010/0178550 A1* | 7/2010 | Kasmer | ......................... | 429/160 |

\* cited by examiner

*Primary Examiner* — Jeffrey Sterrett

(74) *Attorney, Agent, or Firm* — Felix L. Fischer

(57) ABSTRACT

Magnetically induced control signals into a transistorized switching circuit that drives an efficient output transformer provides high frequency control to power circuits with low RFI. Improved co-axial transformer embodiments s and co-axial lead acid battery embodiments are also provided.

10 Claims, 8 Drawing Sheets

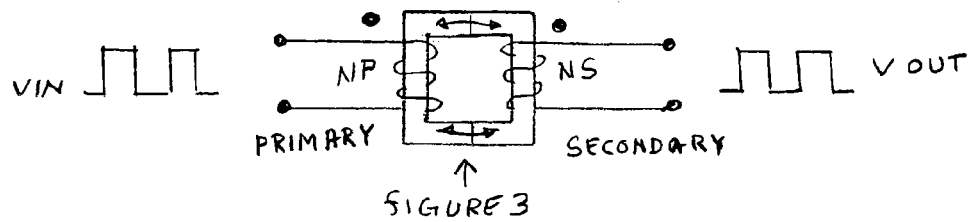
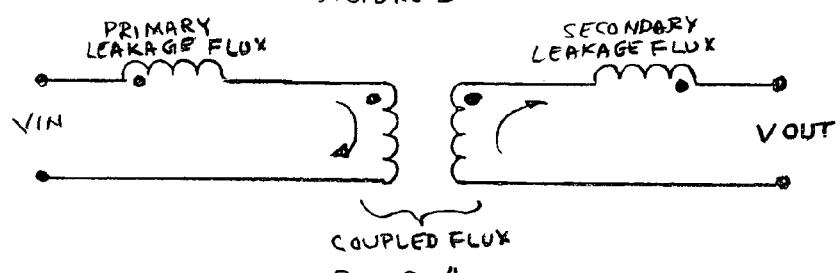
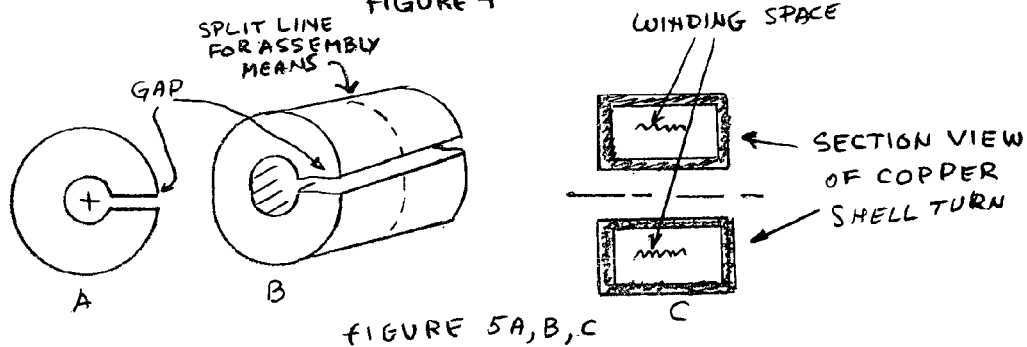
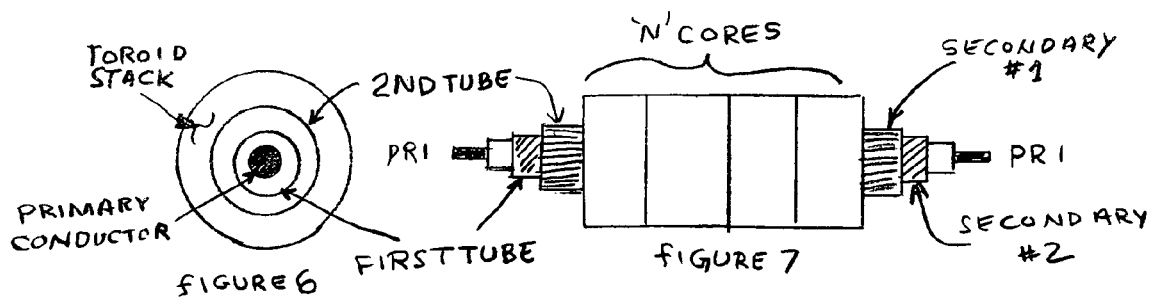

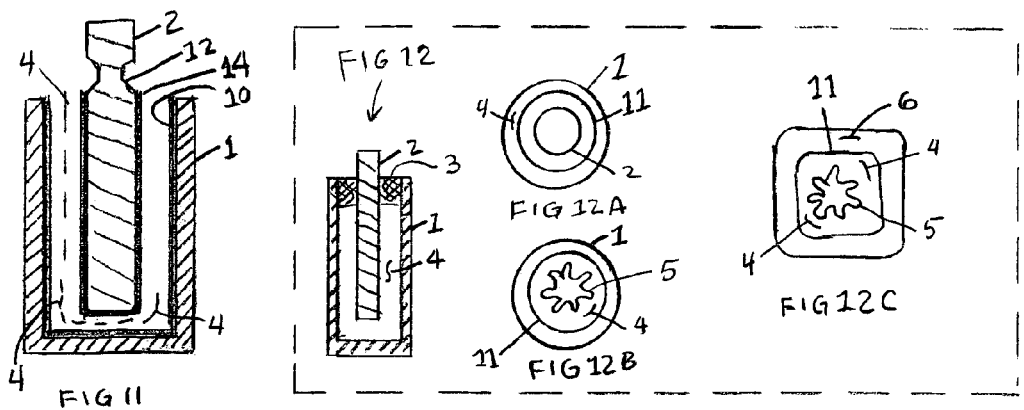
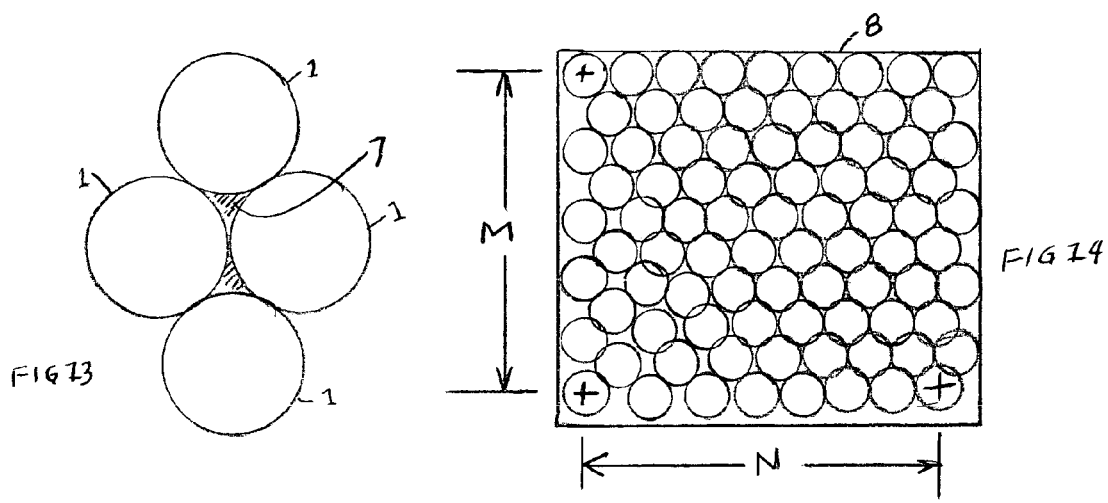
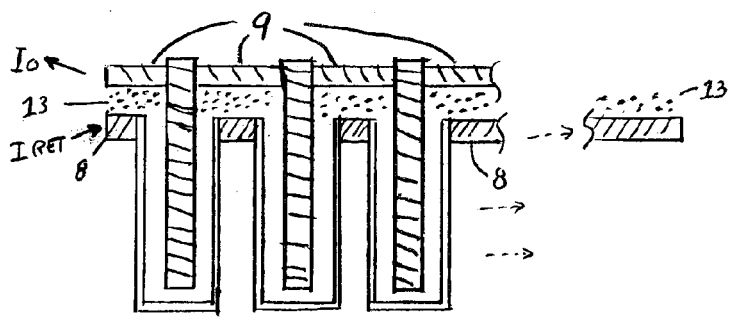

CO-AXIAL SHELL TURN TRANSFORMER

POWER SUPPLY WITH MAGISTOR SWITCHING

This application claims benefit of provisional application Ser. No. 61/204,962, filed Jan. 13, 2009.

BACKGROUND

1. Field of the Invention

The invention is directed to the field of electromagnetic control devices and more specifically to the area of utilizing a magistor switch in such devices.

2. Description of the Prior Art

Functionality, power density, electrical and thermal efficiency, radiated frequency interference (RFI), modularity, reliability and of course costs are all critical factors in determining if any evolving or new electrical/electronic technologies are adopted and employed by entities both government and business. This arena is flush with "catalogue" components that use the basics of physics known for years and are commodities in every sense of the word. In this area, government and industry buy from catalogues and employ components that are proven, yet not entirely optimal for end users in terms of the benefits derived. If one could vastly improve upon such a commodity yet retain commodity status without huge investment, the barriers to entry of such technologies to the market would be eliminated and said technologies embraced. The Magistor invention in all its parts embodies this as described herein.

SUMMARY OF THE INVENTION

The magistor switch of the present invention is a unique connection of a bi-polar silicon or germanium transistor which takes advantage of the carrier storage time inherent in the junction. When a bi-polar transistor is switched 'on', electron charge accumulates in the junction layers and this charge must be flushed out at transistor turn-off. This turn-off problem has historically been the cause of inefficiency in transistor switching and has also contributed to a reduced mean time to failure of the transistor junction. The charge storage problem has also contributed to excessive voltage spikes which are a cause of radio frequency interference (RFI). In this invention, the inherent storage time which normally prevents efficient turn-off is used to maintain transistor conduction by strategically reducing or eliminating the base drive some time prior to the desired turn-off time. Basically, the transistor is initially turned on and then the base drive is reduced or eliminated allowing the transistor to 'idle along' in a state of conduction with no base drive power loss. Then, the transistor turns off, without charge accumulation at the junction, very efficiently and cleanly with minimum spikes and RFI. This is advantageous in any circuit having significant current and voltage switching, and especially where the physical distance of control base currents to the transistor become a significant issue.

Several co-axial battery (lead-acid) embodiments are provided to illustrate a unique manner in constructing individual battery cells and efficient packaging configurations.

Several co-axial shell turn magnetic transformer embodiments are provided to illustrate efficient power transfer devices with low RFI.

Co-axial shell turn magnetic transformers combined with magistor switching technique embodiments are provided in arrays to produce selectable voltages for powering devices and charging individual battery cells.

BRIEF DESCRIPTION OF THE DRAWINGS

FIG. 3 is a representation of a typical transformer with a magnetic ferrite toroid core.

FIG. 4 is an electrical schematic diagram of the transformer shown in FIG. 3.

FIGS. 5A, 5B and 5C are separate views of conductive shell truns.

FIG. 6 is a cross-sectional view of a co-axial transformer with a toroid stack.

FIG. 7 is a plan view of a co-axial transformer with a toroid stack.

FIG. 11 is an elevational cross-section view of a co-axial lead acid battery embodiment.

FIG. 12 is another view of the co-axial battery of FIG. 11 with an insulator/seal element.

FIGS. 12A, 12B and 12C are cross-sectional views of three different embodiments of the co-axial battery shown in FIGS. 11 and 12.

FIG. 13 is a representation of how the circular cross-sectioned battery cells can be stacked and cooled.

FIG. 14 is a representation of an array plate for holding battery cells such as those shown in FIGS. 11 and 12.

FIG. 15 is an elevational cross-sectional of a plurality of co-axial battery cells mounted in the array plate shown in FIG. 14.

DETAILED DESCRIPTION OF THE INVENTION

I. Magistor Switch

Figure 1:
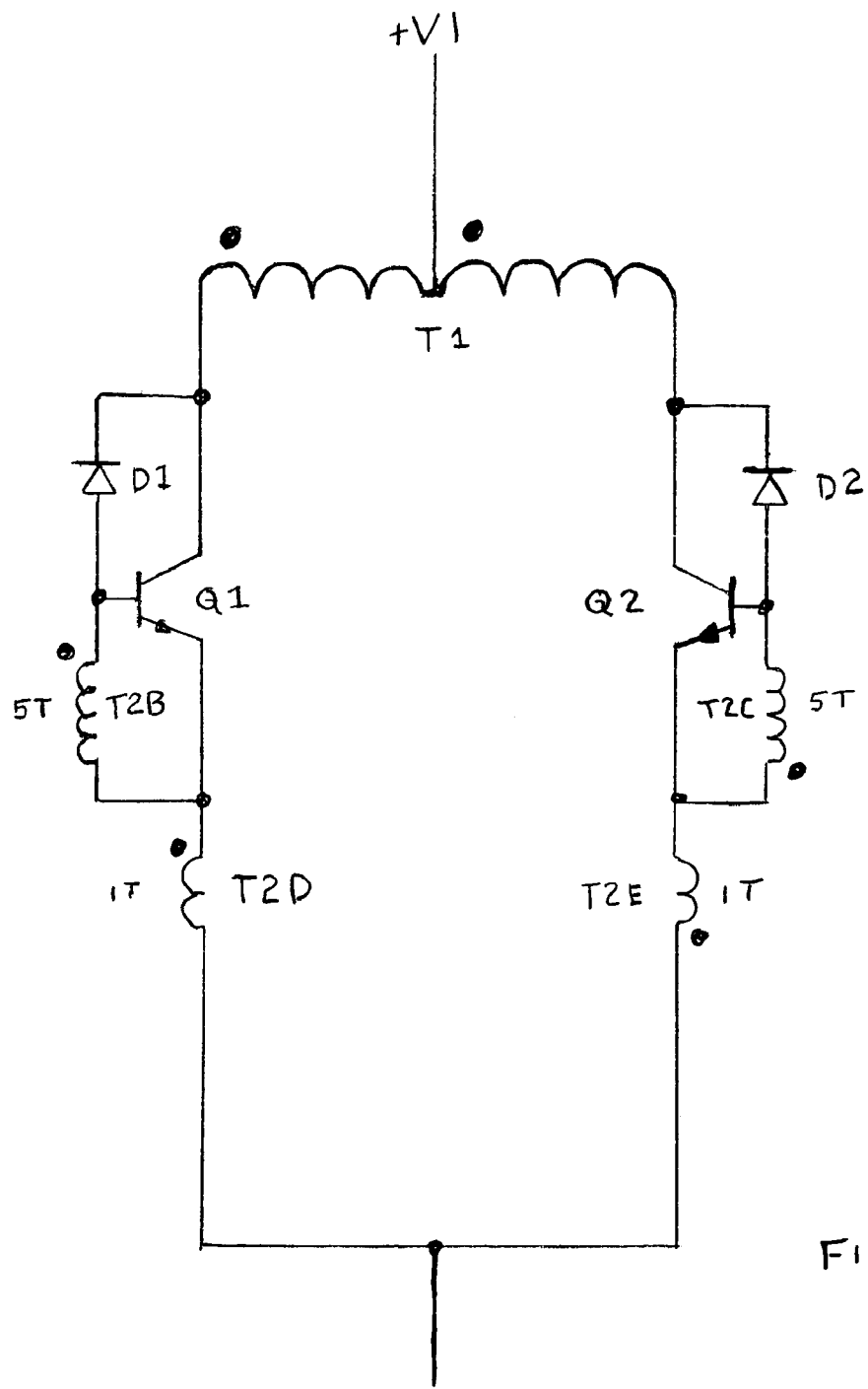
FIG. 1 is a schematic diagram of a magistor switch pair configured to drive a power transformer.
Figure 2A:
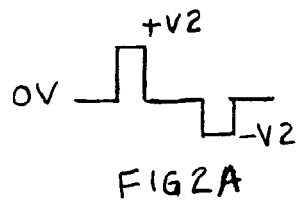
FIG. 2A is an electrical schematic of the primary transformer coil that is used to drive the secondary transformer coils shown in FIG. 1.

One embodiment of the magistor switch of the present invention is shown in FIG. 1. In this first embodiment, a small magnetic toroid of proper high frequency specification is used to directly provide a forced base drive gain, called Beta. In FIG. 1, a power transformer T1 is shown having its center tap connected to a DC power source +V1. Transistors Q1 and Q2 have collectors connected to opposite ends of transformer T1. The anodes of diodes D1 and D2 are connected to the bases of respective transistors Q1 and Q2 and the cathodes are connected to the collectors. A toroid transformer T2 is shown with 5 windings. Three windings T2a, T2b and T2c each have 5 turns and are wound together (tri-filar). Two windings T2d and T2e each have 1 turn. Windings T2d and T2e are actually the passage of the particular transistor Q1 or Q2 emitter lead simply routed through the hole in the toroid transformer T2. Winding T2a serves as the primary winding of the toroid transformer T2 and is depicted in FIG. 2A. Winding T2b is connected between the base and emitter of Q1, while winding T2c is connected between the base and emitter of transistor Q2.

Figure 2B:
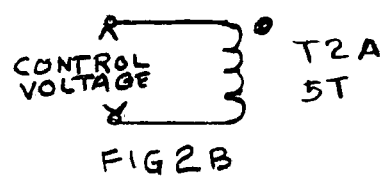
FIG. 2B is a representative waveform as applied to the primary transformer coil of FIG. 2A.

The dots adjacent ends of the windings in FIGS. 1 and 2A represent the 'starts' of the windings which means that an instantaneous positive voltage illustrated in FIG. 2B applied to the start of the control voltage winding T2a in FIG. 2A will cause every start dot for all T2 windings to be simultaneously positive. A negative voltage applied to the start dot of the control voltage winding in FIG. 2A will similarly cause negative voltages at all T2 start dots. The positive control voltage case will supply a startup positive base drive to transistor Q1 and simultaneously a negative base voltage to Q2, thus holding Q2 in the 'off' state. The +V power source will feed current to the center tap of the winding pair on transformer T1 and T1 load current will pass down through Q1 collector-emitter junction which was forced into conduction by the instigation of the + control voltage in FIG. 2. This load current passes through Q1 and then down through the toroid hole (ie: 1 turn winding) causing a 'latching effect' similar to a silicon controlled rectifier (SCR) or IGBT type of device. This 1 turn primary to 5 turn secondary magnetic coupling needs to be very close to Q1 and a beta gain of 5:1 is forced upon the transistor. The return lead of the 5 turn Q1 base connected winding is shown connected directly to Q1 emitter. If packaging dictates that this 5 turn return connection be made at the far side of the 1 turn, directly to V1 return (−), the gain of 5:1 is reduced by 1 since the 1 turn T2 primary voltage drop subtracts from the 5:1 to make the actual forced gain 4:1. A solution in that case is to make the turns 6 instead of 5 and the resultant forced gain is back to 5:1. The full power current switched on by Q1 continues to flow through the T2d toroid fed by Q1 emitter and the forced gain modulates the base drive power in approximation to the actual power/current being switched. If a maximum base drive were always applied, transistor switching efficiency would be severely lowered at light loads due to excessive stored charge in the Q1/Q2 junctions.

The teaching of this invention is to provide a measured base drive commensurate with the actual load current being switched. This kind of a circuit connection also results in the very lowest collector-emitter conduction (on) voltage drop which in turn maximizes overall circuit power conversion efficiency. A typical full power voltage drop for this invention is in the rage of 0.4 to 0.7 volts as compared to an SCR or IGBT which is 1.5 to 2.7 volts. The fast recovery high voltage diodes D1 and D2 sense the conduction voltage of the respective transistors and actually divert some of the base drive from the respective transistor to avoid driving the transistor too hard into conduction where there are excess numbers of stored charge electrons in the junction. D1 and D2 also provide a direct collector sensing means which can be used to provide short circuit protection, to be discussed later. Since the control voltage winding of FIG. 2 is magnetically coupled to, but electrically isolated from the high power circuitry, the behavior of each of Q1/Q2 junctions can be recognized in the waveform reflected back to the control voltage drive circuit and the early diversion of base drive to allow for storage time idling conduction or a system short circuit can be effected.

To recap, the simple waveforms shown in FIG. 2 as applied to the control voltage connection of FIG. 2 will alternately switch Q1 on, then to go off while simultaneously switching Q2 on and then continuing to alternate in a balanced manner. The connection is referred to as a 'bi-polar connection to a bi-filar power transformer'. This is improved by the invention in that the conduction voltage drops are 2-3 times lower than any other power devices like SCR, Triac or IGBT.

The switching frequency of this invention is inherently faster than with the other types of devices which allows for a higher packaging density and less package volume and weight. The slowest operating frequency is dictated by the magnetic core area per unit turn often called 'volt-seconds'. The bigger the core areas, the slower the minimum operating frequency. A single bi-polar transistor with the mirrored twin removed can be used in a single magnetic circuit such as a fly-back magnetic design. An example would be the fly-back voltage of a television tube or an early transistor ignition on cars. If an efficient D.C. on/off control is desired, eliminating T1 from FIG. 1 and connecting a resistive load from +V1 to a common connection the transistor collectors will act as a simple on/off switch.

A poor case of magnetic coupling is shown in FIG. 3. Vin is applied to the primary Np and creates a magnetic flux flowing in a CW/CCW direction as indicated by the solid arrowheads. This changing flux cuts through the secondary Ns, and the resulting Vout is created. There is a factor called leakage inductance coupling which is schematically diagrammed in FIG. 4. The physical spatial disparity causes a large leakage component and this results in huge amounts of radiated and wasted magnetic energy that becomes RFI. Large amounts of RFI require expensive magnetic shielding like mu-metal and cause all sorts of problems for nearby systems and are a potential security problem in today's world.

This invention also teaches a packaging means which drastically minimizes the imperfection of magnetic coupling and I refer to this as co-axial winding. For many years, engineers have occasionally used this technique without the realization of these teachings. A coaxial cable would be wrapped around a magnetic core creating an almost perfect coupling and primary flux was almost entirely captured by the secondary and the radiated RFI was minimal.

Another teaching of this invention is a co-axial shell turn transformer. A conductive shell as shown in FIG. 5 A, B, C is assembled with any combination of primary and secondary windings which fit into the winding space of 5C. A type of core known as a 'pot core' or 'El' core can be used to provide a magnetic circuit as is customary. The primary is wound minus one turn of the desired number and one end of the primary is electrically connected to the shell turn so that the 1 turn shell adds the extra primary turn to reach the desired primary turns number. When the primary is driven by a waveform, any lack of perfect coupling to the secondary (s) is corrected by the shell turn since any leakage flux is automatically scavenged by the shell turn, correcting the coupling as if the transformer were a co-axial winding as described above.

This teaching adds a large range of primary to secondary coupling ratios in addition to 1:1. The shell turn is split in the center of its axial length to allow for assembly and egress of wires. Another teaching of this invention is the co-axial tube shell transformer. The historical practice has been to wrap turns around a single core to support a voltage. The invention teaches that a conductive thin wall tube of copper can be skewered in an assembly of toroid cores like a 'shish kabob' where the number of cores so arranged can together support a desired voltage/frequency. In other words, instead of wrapping turns around a single core, wrap a number of cores turn which is a tube. With unconventional packaging, additional tubes assembled in a concentric manner with electrical insulation between them can form any number of isolated, 1:1 secondaries.

FIGS. 6 and 7 show a simple 2 tube assembly with insulation between the tubes and an insulated primary center conductor surrounded by 'N' toroid cores. The conductive circular mil area with this package is very large. The assembly lends itself to low resistive power loss and high heat transfer capability so the power handling capacity is great.

Figure 8A:
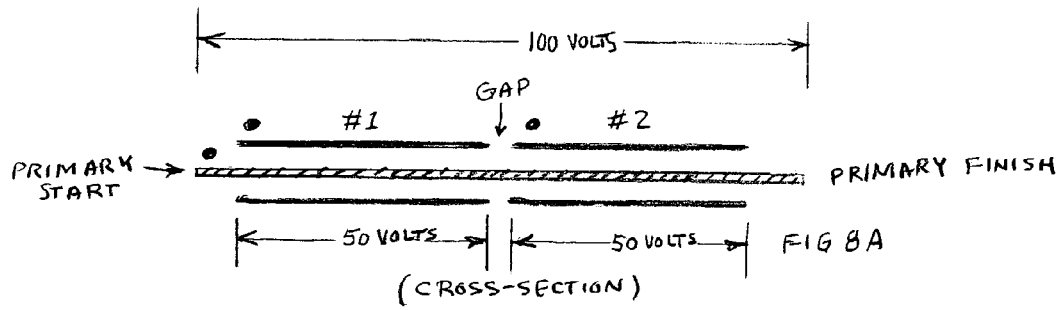
FIG. 8A is a cross-sectional view of a co-axial transformer with two secondary coils.
Figure 8B:
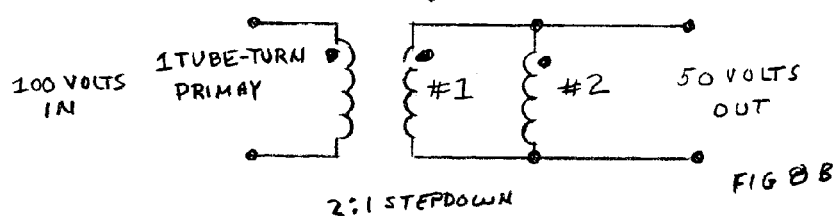
FIG. 8B an electrical schematic diagram of the transformer shown in FIG. 8A.

In addition, another packaging element is possible. The invention teaches that this construction can be structured to create binary ratio reductions. See FIG. 8 which shows a novel transformer construction and the toroid core cross sections are not shown for clarity. In that Figure, a cross-section of the primary single center conductor is shown. Cross-sections of tubes #1 and #2 are shown. There is a minimal isolation gap between tube 1 and 2. The 2 tubes are now connected in parallel as shown in the schematic below the cross-section. This connection results in a 2:1 step-down transformer but it could also be a 2:1 step-up by using the parallel connected tubes as the primary. The skin effect of high frequency magnetic switching is also favorably addressed by this packaging means. Skin effect is the forcing of the conduction to the surface of a conductor. The tubes already are 'surface conductors' by their very nature so the usual power losses due to AC skin-effect increased resistance is minimized by the invention teaching.

Figure 9:
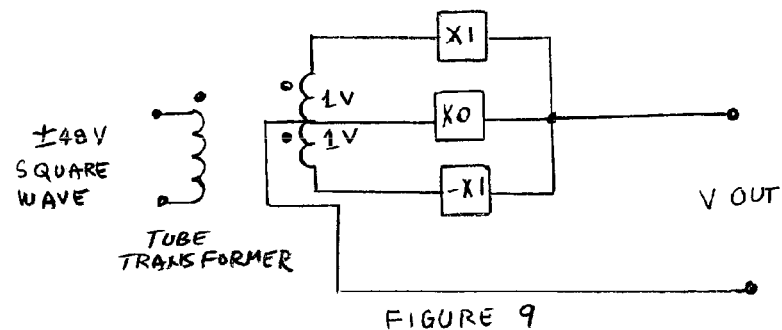
FIG. 9 is an electrical schematic diagram of an array of three magistor switch pairs.
Figure 10:
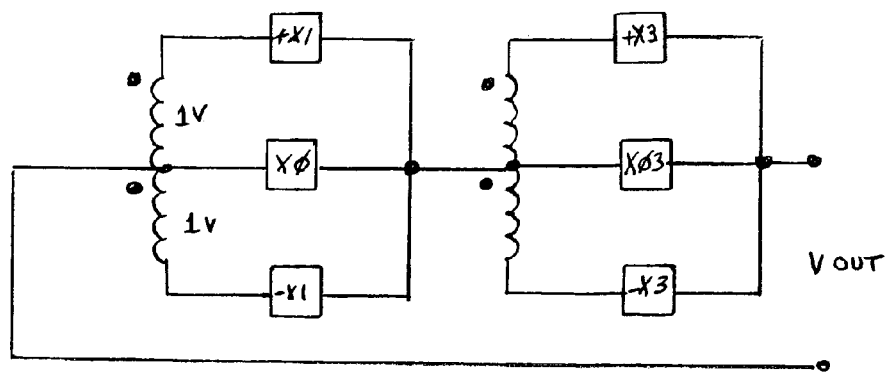
FIG. 10 is an electrical schematic diagram of an array of three magistor switch pairs in series with a second array of three magistor switch pairs driving successively larger power transformers.

In like manner, 3 isolated gap tubes could be shown as a 3:1, and so on, limited only by packaging issues. In addition, tube combinations could be mixed with a 2:1 layer of tubes with an overlay of 3:1 tubes and, say a 10:1 combination on the outside tube layer. The magnetic coupling between all these elements is near perfect and this combination of transformer construction means leads to the next level of the teaching of the invention. Consider a tube transformer assembly based on a 3:1 construction means, and driven by a Magistor switch pair with output voltages of +−1, +−3, +−9, +27, and +−81 volts outputs. Let the primary voltage be a 48 volt battery bank. Now, an array of Magistor switch pairs (X0, X1, and −X1, etc) is connected as shown in FIG. 9. These are not detailed but are operated by isolated control means such that current can flow through any of X1, X2, or X3 in either direction. In other words, only one of the switches is activated at any given instant and 'X0' is a 'bypass' switch which ignores the +−1 volt waveform. The voltage drops of X1, 2, 3 are very low for this 1 volt case. Let's assume that the switching frequency is 50 kilohertz. X1 controls a +−control while −X1 controls −+ with X0 merely passing through the + 1 volt system or being open/off. This is a case of 'Tertiary Logic' because the output V0 has 3 states; +1 volt, −1 volt and zero volts depending on which switch is turned on and in what order. The output V0 can be a steady D.C. by switching X1 or −X1 at the time when those switches can present only a +1 volt output; hence a steady D.C. of +1 volt. In like manner, only minus 1 volt could be presented to Vout as a steady −1 volt. In this simplest case, X0 seems useless. FIG. 10 shows the addition of a second +−3 volt stage in series with the 1 volt stage of FIG. 9. To make +2 volts D.C., X3 and −X1 for the positive cycle or −X3 and +X1 for the negative cycle will do it. X3 plus X1 makes +4 or −4 steady. For +3 or −3 volts out, X0 is now turned on to complete the path. And for many cases in higher order voltage constructs, X0 is used very often. The tertiary construct of voltages; 1, 3, 9, 27, 81 and 243 or 1, 3, 9, 27, 81 and 81 again for higher voltages if needed will staircase a 120 volt sine wave with a step of 1 volt straddling the true sine function to create a sine wave with a distortion from true better than +−0.5%. This constructed sine wave can be connected to an A.C. power source and a battery bank can be directly charged with the load presented to the power company looking like a resistive load of unity power factor.

The addition of a semiconductor main line disconnect on the power source side of the connection can instantly continue the smooth flow of A.C. constructed power to critical loads without a glitch. When the power company source recovers, the Magistor constructor can slowly change its constructed output frequency to line up the waveform phase just like synchronizing generators at the power station and reclose the line interrupter and everything continues unabated. A teaching here is that the Magistor constructor is equally capable of bi-directional power flow in fractions of a microsecond.

Another teaching of the Magistor constructor is that it can simultaneously be capable of a number of electrically isolated differing frequencies including D.C. to charge batteries. A tube transformer system can present isolated constructs of 1, 3, 9, 27, 81, 81, 243, 243 to separate Magistor wave constructors. The separate constructors can create field selectable voltages and operating frequencies. For example, a triple constructor could simultaneously make 120/240 60 Hz single phase while another constructor could simultaneously make 250 volt 50 Hz. The third could make 208 volt 400 Hz. and D.C. to charge batteries comes as a bonus with the constructor. If a 3 phase system were desired, an additional triple constructor would be needed. These would all be field selectable with the flip of a switch. The packaging form factor of the constructor is longer with a small cross section which is ideal for many packaging situations. The power density is fully 3-5 times as dense as any existing technology and the efficiency is in the high 90's.

In the growing field of electric vehicles, the Magistor system solves a critical limitation of battery systems. A usable battery voltage is achieved by series connecting a number of individual cells. If one cell in the string is weak, it is a weak link and becomes a dangerous element if all the other batteries gang up to push the vehicle power through the weak sister in reverse. Heavy rectifiers must be added in parallel as a safety bypass means to avoid explosion. This connection also reduces overall battery life as different cells become weak for different reasons and that continually changes. The Magistor Synergy drive uses a tube transformer system and low voltage, fast very high current germanium or silicon rectifiers to work off the overall system voltage and to develop as many tube outputs of individual cell voltage plus Germanium or silicon rectifier drop so that each cell in the string is supported by a step-down from the overall voltage to individually prop up each weak cell thus eliminating the explosion hazard and increasing the work life of the battery system which will lower the replacement cost of the battery set; and they will all be replaced at the same time instead of one here and there spread out over time. This will lower the cost per mile for batteries and improve performance.

To summarize the teaching of the co-axial shell Magistor transformer system, any combination of co-axial conduction tubes which can be co-insulated such that the assemblage can fit within the toroid donut hole with a number of cores from 1 to N, and packaging conduction tabs exiting between adjacent cores can access the individual co-axial tube windings can form a very efficient and power dense 'constructor' which can directly connect a D.C. voltage source with electrical isolation to form any number of outputs from D.C. maximum to negative maximum, D.C. with AC override, straight AC, a wide range of AC operating frequencies, square waves, ramp waves, D.C. drive for golf carts, forklifts and electric cars. Every case of instantaneous connection is a direct connection between the D.C. power source and the desired output load/ voltage with electrical isolation. In mechanical terms, the Magistor system operates like a multi-range transmission having hundreds or thousands of independent ratios separated by a single ratio number; ie: 1:1, 1:2, 1:3, 1:4, 1:5, , , , , 1:23, 1:24, 1:25, , , , , 1:281, 1:282, 1:283, , , , , 1:999, 1:1000 and so on. In the mechanical case, one could select an exact ratio for a given load/speed of a vehicle. The physical impossibility of such a transmission's weight, size, etc and the workload of shifting is clearly impossible. The Magistor system in fact provides the electro-magnetic representation of the impossible mechanical case.

II. Co-Axial Lead Acid Battery

For the description, FIGS. 11 through 15 are shown. FIG. 11 illustrates an embodiment of a lead acid battery which is fundamentally different than conventional and historical battery construction. Copper tube 1 coaxially surrounds a center copper round conductor 2 which is suspended inside the tube 1 so as to prevent and eliminate short circuit contact between the copper elements. FIG. 12 shows a smaller cross section view of the view in FIG. 11 and an insulator/seal element 3 is shown schematically as a mesh in FIG. 12. This element 3 is both an electrical insulator and hermetic seal which is sealing the electro-chemical behavior, gassing, etc within the individual co-axial cell module. This insulator/seal 3 is not shown in FIG. 11 to simplify the drawing. Referring again to FIG. 11, a lead plate coating 10 covers the interior surface of the tube 1 and a separate lead plate coating 14 covers the immersed portion of the center copper conductor 2. With the insulator/seal element 3 in place, the entire encapsulated surface is now lead and a battery paste electrolyte material 4 such as is used to manufacture conventional lead acid batteries occupies the interior space completely and chemically reacts and interfaces with the two lead surfaces and the fundamental lead acid cell is formed. This cell can be charged and polarized in either direction as is the case with the historical lead acid battery. The construction means and the use of copper as the main current conduction means results in a significantly lower internal D.C. resistance and the thermal conduction of the unit cell's copper is a significant help in removing any internal heat. The reduced cross-section neck 12 of the center conductor can act as a safety fuse in the event of an internal short circuit. Several end views are also shown in FIG. 12. FIG. 12A shows the simplest form of the cell. The internal conduction surface area 11 of the cell in FIG. 12A is greater that the conductive area of the center conductor 2 which may present an unbalance of chemistry. FIG. 12B shows a 'serrated' or "fluted" center conductor 5 which can have a surface area 11 equal to that of the conductive surface area 11 of tube 1. FIG. 12C shows a 'square' tube with a serrated or fluted center conductor 5 to maximize the packaging density of the technology.

In FIG. 13, 4 equal outside diameter cell tubes are shown touching each other. The space 7 between the tubes allows for a circulating fluid such as air or thermally conductive silicon fluid or any suitable fluid. The square construction of FIG. 12C can be used to minimize the space 7 for maximizing the energy density if cooling is not an issue.

In FIG. 14, a copper mounting frame plate 8 shown as having holes punched through so as to align a plurality of unit cells so that the cells. Cells are permanently installed in plate 8 and shown in cross section view FIG. 15. The plate 8 electrically and thermally connects all unit cell tubes together to electrically parallel the individual cell capacity. A similar copper plate 9 has an identical hole pattern layout to that of plate 8 but the holes are smaller to accommodate and electrically connect all the unit cell center conductors 2 together. An insulating layer 13 is located between plates 8 and 9 to prevent electrical shorts. The reason for locating plates 8 and 9 so close physically has to do with the cancellation of high magnetic fields caused by very high currents. The close proximity if equal and opposite current flows results in a near cancellation of the high magnetic fields present in conventional electric vehicles. The assembly of plates 8 and 9 function as bus terminals with an arrayed complement of unit cells constitutes a 2.2 volt lead acid cell as in a conventional lead acid battery. Any number of the arrayed 2.2 volt cells can be connected in series to create a higher battery voltage. The length of the unit cell can be varied in production for different applications. The mass production of unit cells creates a basic component which can be arrayed in different array numbers which are the product of 'M' times 'N' cells as shown in FIG. 14. The same kind of co-axial construction can be used with other types of battery chemistry such as nickel alkaline, etc.

III. Co-Axial Shell Turn Magnetic Transformer (Additional Descriptions)

Figure 16:
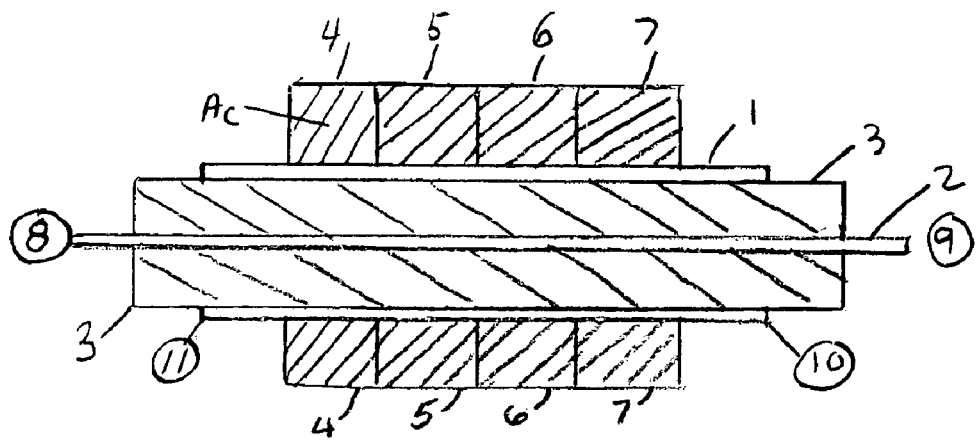
FIG. 16 is a cross-sectional view of a co-axial shell turn transformer with a single primary and single secondary coil.

A construction means utilizing magnetic ferrite cores is described in FIG. 16. Copper tube 1 coaxially surrounds a copper center conductor 2. An insulating sleeve material 3 is unaffected by magnetic or electric field oscillations. Magnetic toroid cores 4, 5, 6 and 7 coaxially surround copper tube 1. Each core has an effective magnetic core area Ac. Core area Ac limits the voltage applied to a single turn for a given cyclic time period. This is referred to as 'volt-seconds' in the field of magnetics. The physical passage of the copper tube 1 and the copper center conductor 2 through the core 4 is a single turn 'around' the core area Ac. The field of magnetic transformers historically wraps a number of turns around a core area to achieve a desired result. The basic theme of this invention is to 'wrap' a number of cores around a turn. 4 cores are shown FIG. 16.

The equivalent magnetic behavior historically would be achieved by wrapping 4 turns around a single core. This invention wraps 4 cores around a single turn. A historical problem with wrapping a number of turns around a single core is that there must be a primary and secondary winding to constitute a transformer. It would take 4 turns of primary winding and 4 more turns of secondary winding through a single core such as 4 with core area Ac to equal the behavior of the 1:1 transformer of FIG. 16. Fitting 8 turns through the inside hole of the toroid limits the copper conductive area of the 4 turn primary and secondary because each turn must be smaller in order to fit 8 turns through the toroid hole. Another more subtle problem is the 'spatial' dis-association of the primary and secondary windings. In the FIG. 16, any changing magnetic flux generated by either the center conductor or the co-axial tube MUST magnetically link the other turn in near perfection. The use of a 4 turn primary and 4 turn secondary is far from perfect in magnetic linkage and this parameter is called 'leakage inductance'. This leakage inductance spews leaking, uncoupled magnetic flux into surrounding circuitry and is a major source of radio frequency interference (RFI) and some energy loss. The co-axial shell turn has near perfect magnetic coupling and the leakage inductance is near zero. This greatly reduces RFI and radiated energy loss. It also greatly reduces an uninvited electronic eavesdropping problem as RFI can be analyzed at a distance with conventional technology. An electrical square wave voltage applied to terminals 10 and 11 in FIG. 16 will create an identical (to measurable limits) square wave output at terminals 8 and 9. Application to terminals 8 and 9 will result in the exact same output at terminals 10 and 11. The very low D.C. resistance of the conductors 1 and 2 will minimize any heat loss under load and the result will be very high efficiency.

Figure 17:
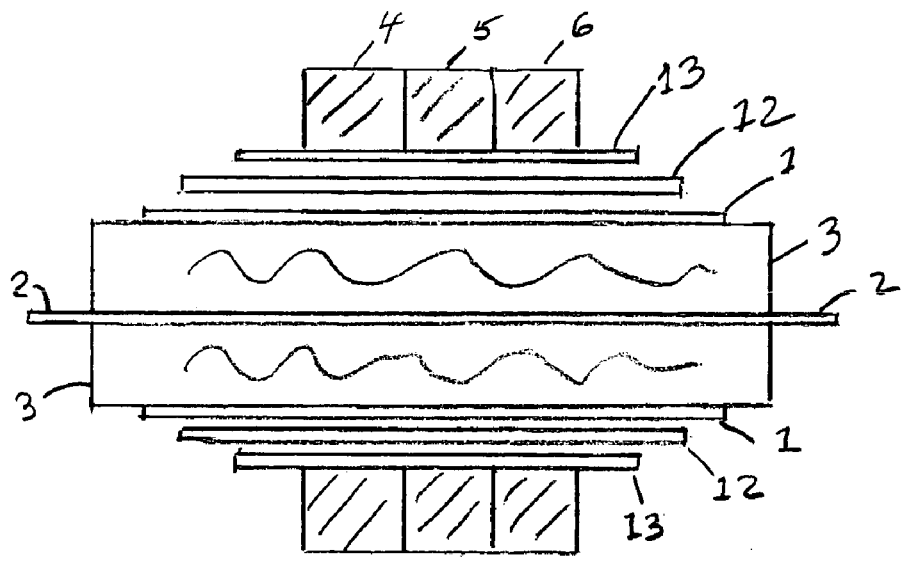
FIG. 17 is a cross-sectional view of a co-axial shell turn transformer with a single center conductor, a plurality of concentric nesting tubes and a plurality of toroid cores.

FIG. 17 shows a co-axial 'concentric nesting' of tubes 1, 12 and 13 separated by an insulating layer (not shown) surrounding center conductor 2. Each of these elements will have an exactly identical instantaneous voltage generated by any of the tubes or center conductor selected as the primary.

Figure 18:
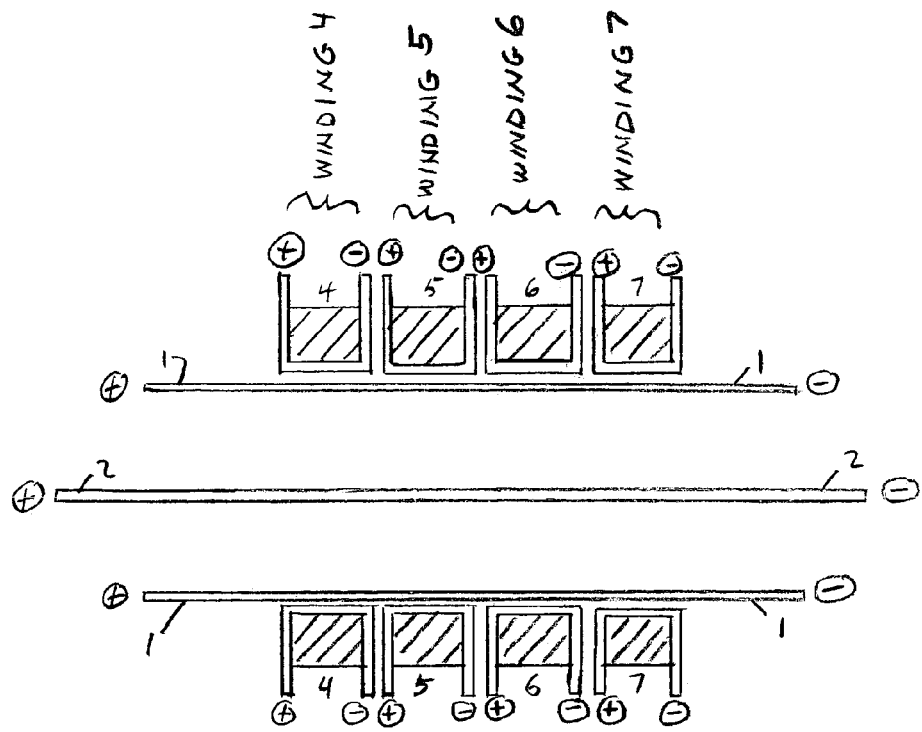
FIG. 18 is a cross-sectional view of a co-axial shell turn transformer with a single center conductor, concentric tube and a plurality of toroid cores with separate co-axial turns around each core.
Figure 18A:
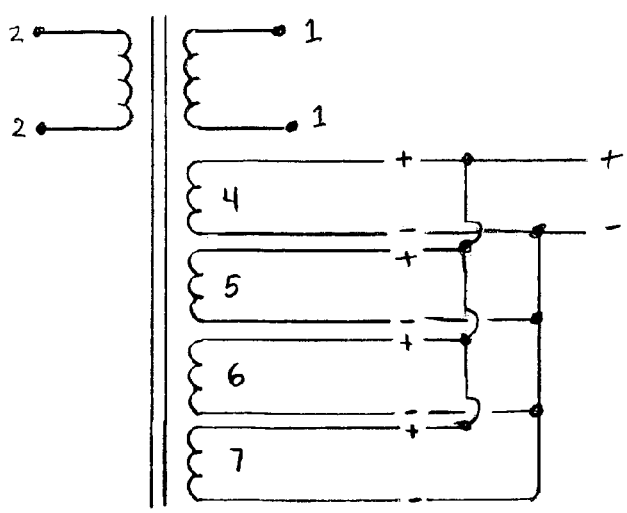
FIGS. 18A and 18B are electrical schematic diagrams showing how the coaxial turns of FIG. 18 may be connected to provide different power outputs.
Figure 18B:
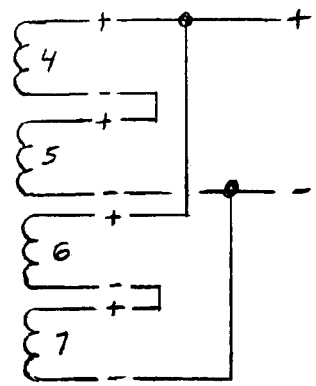

FIG. 18 shows 4 individual co-axial shell turns around each of ferrite or ceramic magnetic toroid cores 4, 5, 6 and 7. Insulating material is, of course present between al conducting elements, but is not shown here, for clarity. There are 2 possible secondary connections for the windings 4, 5, 6 and 7. One connection is shown in the FIG. 18A schematic as a parallel connection of all 4 windings. Since the voltage equally divides across the individual turns around each equal area core; 4, 5, 6, and 7, this connection results in a 4:1 ratio step down transformer and is similar in operation to a conventional 4:1 transformer winding. In the conventional winding, the large numbers of primary turns are more spatially disjoint from a much lesser secondary winding resulting in increased leakage of the magnetic field. The co-axial 4:1 step down transformer has the same near zero leakage and is a much superior construction means in terms of efficient and minimized RFI. FIG. 18B shows a series parallel connection which creates a 2:1 coaxial step-down with the above characteristics. Naturally, any of the connections can be used as a step up transformer as well.

Any number of coaxial turns that can be packaged with insulation between the turns such that everything goes through the toroid hole is acceptable. One example involves a series connection of batteries; say 220 volts D.C. as might be used in an electric hybrid vehicle. Assume the use of 100 toroid cores in an array where each core has 2 shell windings. These windings are connected in a 'full wave centertap' using low voltage drop rectifiers. Each such + and − rectified D.C. output straddles an individual 2.2 volt lead acid cell. Thus there are 100 toroids and 200 rectifiers creating 100 rectified, potentially high current outputs. Each of these rectified D.C. outputs is connected across an individual cell. The sum of the cells is 220 volts D.C. and this voltage is chopped into a square wave using Magistor technology. The result is that each individual cell sees 1/100 of the overall series cell voltage applied across it. A serious problem in series battery systems is the weakness or failure of an individual cell which then becomes reversed with the full power of all the other cells creating a fire and explosion hazard. The Magistor coaxial transformer booster takes the overall battery voltage and individually boosts weak or dead cells to their normal voltage. One result is that the battery bank is manipulated to extract most of the sum of the individual battery energy storage amounts instead of going downhill at the whim of the weak cells. The bottom line is that more of the theoretical battery storage is utilized for increased range.

IV. Co-Axial Shell Turn and Magistor Switching (Additional Descriptions)

Figure 19:
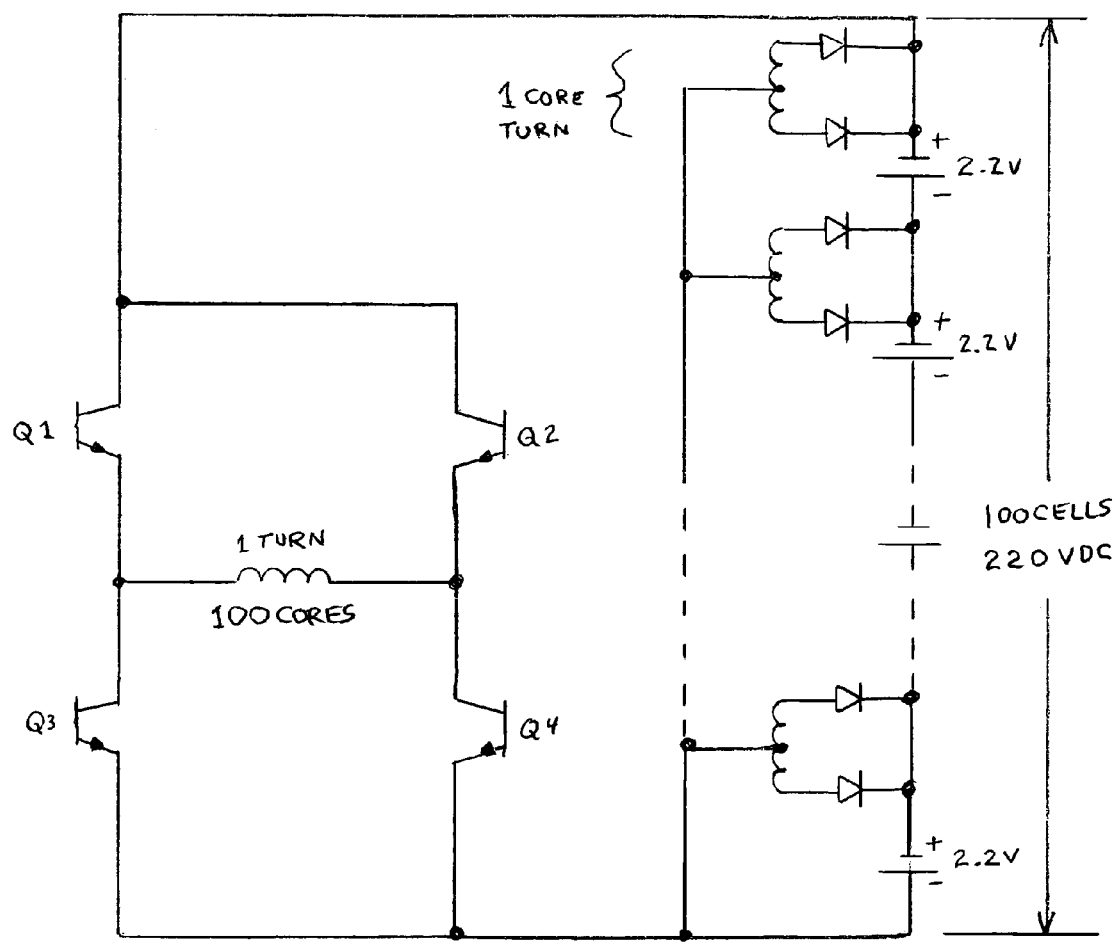
FIG. 19 is an electrical schematic diagram of a magistor switch bridge configured with a co-axial shell turn transformer with a corresponding number of cores to control individual battery cell charging in an array of battery cells.
Figure 20:
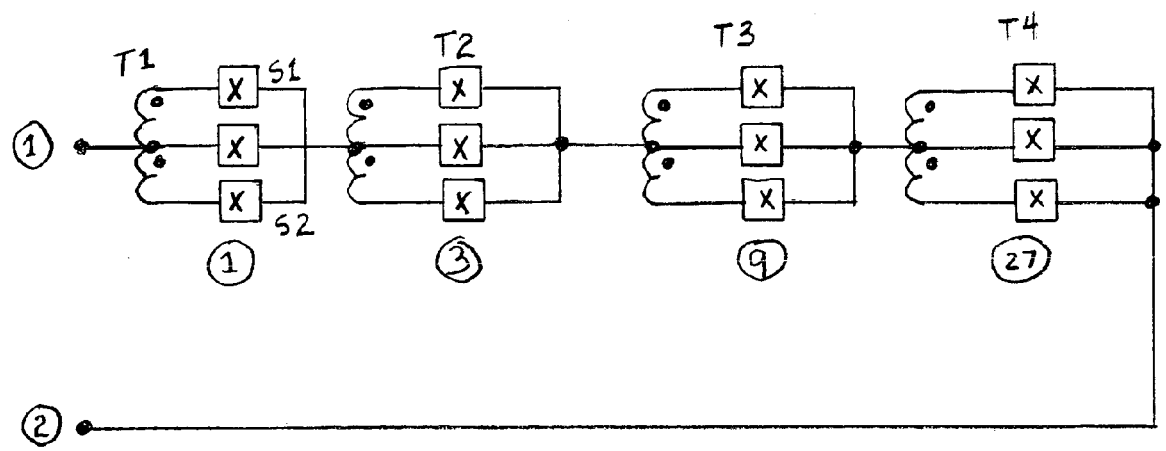
FIG. 20 is an electrical schematic diagram of several arrays of three magistor switch pairs in series and connected to successively larger power transformers to provide selective voltages at the output.

Any transformer operates by the constant changing of the magnetic field. In FIG. 20, an array of 4 transformer windings is shown. These can be created using the co-axial shell turn technology and be driven by a Magistor bridge drive like that shown in FIG. 19. Assume a battery voltage of 40 volts D.C. applied to the bridge circuit. A series parallel connection as defined for the co-axial shell turn transformer is used to create voltages of +−1, +−3, +−9, and +−27 volts for transformers T1-T4 as shown in FIG. 20. An array of Magistor bipolar bi-directional switches are depicted by the boxes marked X. If the center tap switch for all 4 transformers is engaged, there will be no voltage across terminals 1 and 2; and there will appear to be a direct connection between terminals 1 and 2 which will carry reactive current and power. Assume a + 1 volt output between terminals 1 and 2 is desired. Center tap switches for T2, T3 and T4 are engaged allowing through current to pass in either direction. All 'starts' shown for the transformers are simultaneously positive or negative at the same time. If terminal 1 is to be positive D.C., the switch S2 is 'on' when the start is positive which translates to +1 volt at input 1 with the—return going through the other 3 center tap switches and round to terminal 2 for the 1 volt return, or (−). When the Magistor bridge switches polarity, S2 is turned off and instead S1 is turned 'on'. The result is a continuation of the +1 volt at terminal 1 relative to terminal 2. By means of a similar manipulation of T2, + 3 volts D.C. could be maintained at terminals 1-2. The same is true for 9 volts and 27 volts; all being D.C. The opposite selection of switch order would create the negative voltage at terminal 1 with respect to terminal 2. To create + 2 volts, the switches for T1 and T2 are manipulated so that: +3−1=+2 for both polarity cases of the Magistor bridge circuit. 4 volts is 3+1, 5 volts is +9−3−1, +6 is +9−3, etc, etc all the way to +40 volts and down to −40 volts for 80 steps in 1 volt increments. This system is completely bi-directional in that power can flow out to a load or can be returned from a reactive load with equal efficiency. This system is also short circuit proof and overload protected by virtue of the Magistor switch operation. The next voltage step is +−81 volts for a 'T5' added to the circuit of FIG. 20. This added step will reach 81+27+9+3+1=+−121 volts for a 1 volt step system with 244 steps of 1 volt each between −121 volts to +121 volts. If the step voltage were 1.32 volts, a very accurate 120 volt sine wave would be created with distortion less that 1%, load/voltage correction, overloads and short circuit protection and equal bi-directional power flow. A connection to an A.C. input would charge a D.C. battery bank all the time with current control and voltage high limit. If the power failed, the sine wave would 'immediately 'back feed' to enable the continuation of the sine wave to sensitive equipment, utilizing a semiconductor line switch to disconnect the grid until it was restored. At some random time, the grid would restore but the sine wave phasing would likely be out of phase. The Magistor control could slowly realign the phase and reconnect to the grid, going back into a charging mode. This is the ultimate UPS system.

There are many other connections available to do presently impossible tasks. For example, a Magistor bridge could interface with a direct drive generator which was capable of directly starting an engine. This interface would go through an array of Magistor switches and co-axial transformers, possibly interfacing with the co-axial battery. A number of coaxial shell turns could be packaged to create the 1, 3, 9, 27, 81, 244 +− outputs in triplicate and 3 Magistor 'Tertiary' power systems with 3 phase phasing could 'construct' a 208/120 3 phase Wye center-tap or 220 volt Delta connection at 60 hertz. With a flip of a switch, the operating frequency could become 50, 60 or 400 hertz with different voltages and all off the same battery. The Magistor system could also directly interface with an auxiliary motor/generator.

As can be seen by the drawings and accompanying explanation, the present invention is a unique improvement over conventional power switching and transfer systems. And while the embodiments shown here are preferred, depending on the engineering applications and requirements, they shall not be considered to be a restriction on the scope of the claims set forth below.

I claim:

1. A magnetically controlled switching circuit comprising:
a first transistor connected between a first end of a primary of an output transformer and a first single coil secondary of a control transformer;
a second transistor connected between a second end of said primary of said output transformer and a second single coil secondary of said control transformer;
the base of said first transistor connected to a first end of a first multi-coil secondary of said control transformer;
the base of said second transistor connected to a first end of a second multi-coil secondary of said control transformer;
wherein said output transformer has a center tap terminal that is connected to an output power source, and said first single coil and said first multi-coil secondaries of said control transformer are in polar opposition to said second single coil and said second multi-coil secondaries of said control transformer.

2. A magnetically controlled switching circuit as in claim 1, wherein the second ends of said first and second multi-coil secondaries of said control transformer are respectively connected to the same end of said first single coil secondary and said second single coil secondary as each respective transistor is connected.

3. A magnetically controlled switching circuit as in claim 2, wherein the ends of said first single coil secondary and said second single coil secondary, opposite to which said transistors are respectively connected, are commonly connected to the common terminal of said output power source.

4. A magnetically controlled switching circuit as in claim 2, wherein the gain relationship between said first multi-coil secondary and said first single secondary of said control transformer is on the order of 5:1.

5. A magnetically controlled switching circuit as in claim 2, wherein said first and second single coil secondaries and said first and second multi-coil secondaries are energized by a common primary winding of said control transformer.

6. A magnetically controlled switching circuit as in claim 1, wherein said control transformer is a toroid transformer and said first and second single coil secondaries are leads extending from the respective transistors through the center hole of said transformer toroid.

7. A magnetically controlled switching circuit as in claim 1, wherein a diode is connected between said base of each transistor and the corresponding connection to the primary of said output transformer.

8. A magnetically controlled switching circuit as in claim 1, wherein said control transformer is a co-axial transformer, comprising a primary central conductor defining an axis, at least one secondary tube conductor co-axially surrounding said primary conductor, a plurality of magnetic toroids having center holes mounted to surround said primary and secondary conductors and said first and second single coil secondaries are defined by a lead from each respective transistor passing through separate ones of said toroids.

9. A magnetically controlled switching circuit as in claim 8, wherein said first and second multi-coil secondaries correspond to first and second secondary tube conductors co-axially surrounding said primary conductor and the number of said toroids surrounding said primary and secondary conductors corresponds to the gain relationship between said multi-coil coil secondaries and said single secondaries.

10. A magnetically controlled switching circuit as in claim 1, wherein said output transformer is a co-axial transformer comprising a primary central conductor along a central axis, at least one secondary tube conductor co-axially surrounding said primary conductor, a plurality of magnetic toroids having center holes mounted to surround said primary and secondary conductors, wherein said number of toroids correspond to the number of output secondaries desired and each toroid is individually wrapped with conductors that function as corresponding output secondaries.

* * * * *